(12) United States Patent  (10) Patent No.: US 7,675,072 B2
Konno et al.  (45) Date of Patent: Mar. 9, 2010

(54) LIGHT EMITTING DIODE

(75) Inventors: Taichiroo Konno, Tokyo (JP); Masahiro Arai, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/955,063

(22) Filed: Dec. 12, 2007

(65) Prior Publication Data

US 2008/0099773 A1   May 1, 2008

Related U.S. Application Data

(62) Division of application No. 10/807,413, filed on Mar. 24, 2004, now abandoned.

(30) Foreign Application Priority Data

Mar. 31, 2003  (JP) .............................. 2003-097028
Mar. 31, 2003  (JP) .............................. 2003-097030

(51) Int. Cl.
   *H01L 27/15*   (2006.01)
(52) U.S. Cl. .............................. 257/79; 257/81; 257/94; 257/102; 257/E21.349; 438/22; 372/43.01; 372/45.01
(58) Field of Classification Search ........................ None
   See application file for complete search history.

(56) References Cited

U.S. PATENT DOCUMENTS

| 5,600,158 A * | 2/1997 | Noto et al. ..................... 257/94 |
| 5,856,682 A | 1/1999 | Sasaki |
| 5,869,849 A | 2/1999 | Jou et al. |
| 6,350,997 B1 | 2/2002 | Saeki |
| 6,495,862 B1 | 12/2002 | Okazaki et al. |
| 7,034,342 B2 * | 4/2006 | Shakuda et al. ................ 257/94 |
| 2002/0104997 A1 * | 8/2002 | Kuo et al. ...................... 257/79 |
| 2002/0137243 A1 | 9/2002 | Chen et al. |
| 2002/0137244 A1 * | 9/2002 | Chen et al. ..................... 438/22 |
| 2003/0111667 A1 | 6/2003 | Schubert |
| 2005/0095768 A1 | 5/2005 | Tsuda et al. |

FOREIGN PATENT DOCUMENTS

JP          08-097467 A       4/1996

(Continued)

OTHER PUBLICATIONS

Konno et al, computerized translation from the JPO of Konno et al (see IDS), "Semiconductor Light Emitting Element", JP 2002-2344017, published Nov. 29, 2002.*

(Continued)

*Primary Examiner*—Evan Pert
*Assistant Examiner*—Scott R Wilson
(74) *Attorney, Agent, or Firm*—Foley & Lardner LLP

(57) ABSTRACT

In a light emitting diode, a light-emitting region is including an active layer provided between a first conductivity type cladding layer formed on the semiconductor substrate and a second conductivity type cladding layer. A transparent conductive film made of a metal oxide is located over the light-emitting region. A layer for preventing exfoliation of the transparent conductive film, the preventing layer being made of a compound semiconductor contains at least aluminum and is located between the light-emitting region and the transparent conductive film. The layer for preventing exfoliation of the transparent conductive film contains a conductivity type determining impurity in a concentration of $1 \times 10^{19}$ cm$^{-3}$ or higher.

44 Claims, 9 Drawing Sheets

FOREIGN PATENT DOCUMENTS

| | | | |
|---|---|---|---|
| JP | 11-307810 A | | 11/1999 |
| JP | 2000-174344 A | | 6/2000 |
| JP | 2000-312028 A | | 11/2000 |
| JP | 2001-015798 A | | 1/2001 |
| JP | 2002-232005 A | | 8/2002 |
| JP | 2002-344017 A | | 11/2002 |
| JP | 2002344017 A | * | 11/2002 |

OTHER PUBLICATIONS

M. Fukuda, "Optical Semiconductor Devices", John Wiley Series in Microwave and Optical Engineering, Kai Chang, Ed., John Wiley & Sons 1998 (ISBN: 0-471-14959-4), New York; pp. 82-84.*

Konno et al., computerized translation from the JPO of Konno et al., "Semiconductor Light Emitting Element", JP 2002-2344017, published Nov. 29, 2002.

M. Fukuda, "Optical Semiconductor Devices", John Wiley Series in Microwave and Optical Engineering, Kai Chang, Ed., John Wiley & Sons 1998 (ISBN: 0-471-14959-4), New York; pp. 82-84.

Temkin et al., J. Applied Physics 51(6), Jun. 1980 (pp. 3269-3272).

Y.H. Aliyu et al., "AlGaInP LEDs Using Reactive Thermally Evaporated Transparent Conducting Indium Tin Oxide (ITO)", Electronics Letters, vol. 31, No. 25, Dec. 7, 1995, pp. 2210-2212.

* cited by examiner

- 18 CIRCULAR p- ELECTRODE
- 17 ITO FILM (TRANSPARENT CONDUCTIVE FILM)
- 16 p-TYPE (Zn DOPED) AlGaAs LAYER
- 15 p-TYPE (Zn DOPED) $(Al_{0.7}Ga_{0.3})_{0.5}In_{0.5}P$ CLADDING LAYER
- 14 UNDOPED $(Al_{0.10}Ga_{0.90})_{0.5}In_{0.5}P$ ACTIVE LAYER
- 13 n-TYPE (Se DOPED) $(Al_{0.7}Ga_{0.3})_{0.5}In_{0.5}P$ CLADDING LAYER
- 12 n-TYPE (Se DOPED) GaAs BUFFER LAYER
- 11 n-TYPE GaAs SUBSTRATE
- 19 n- ELECTRODE

- 18 CIRCULAR p- ELECTRODE
- 17 ITO FILM (TRANSPARENT CONDUCTIVE FILM)
- 16 p-TYPE (Zn DOPED) $Al_{0.05}Ga_{0.95}As$ LAYER
- 111 p-TYPE (Zn DOPED) GaP CONTACT LAYER
- 15 p-TYPE (Zn DOPED) $(Al_{0.7}Ga_{0.3})_{0.5}In_{0.5}P$ CLADDING LAYER
- 110 UNDOPED OR p-TYPE (Zn DOPED) $(Al_{0.7}Ga_{0.3})_{0.5}In_{0.5}P$ LAYER
- 14 UNDOPED $(Al_{0.10}Ga_{0.90})_{0.5}In_{0.5}P$ ACTIVE LAYER
- 13 n-TYPE (Se DOPED) $(Al_{0.7}Ga_{0.3})_{0.5}In_{0.5}P$ CLADDING LAYER
- 12 n-TYPE (Se DOPED) GaAs BUFFER LAYER
- 11 n-TYPE GaAs SUBSTRATE
- 19 n- ELECTRODE

LIGHT EMITTING DIODE

The present application is a divisional of U.S. Application Ser. No. 10/807,413, filed Mar. 24, 2004, the entire contents of which is incorporated herein by reference.

The present application is based on Japanese patent application Nos. 2003-097028 and 2003-097030, the entire contents of which are incorporated herein by reference.

BACKGROUND OF THE INVENTION

1. Field of the Invention

The present invention relates to a light emitting diode made of an AlGaInP-based compound semiconductor, and particularly to a light emitting diode with high luminance which can prevent exfoliation of a transparent conductive film made of a metal oxide, and is manufactured inexpensively.

2. Description of the Related Art

Most of conventional light emitting diodes are green GaP (gallium phosphide) and red AlGaAs (aluminum gallium arsenide). In recent years, however, since a technology wherein GaN (gallium nitride)-based or AlGaInP (aluminum gallium indium phosphide)-based crystal layers are grown by means of MOVPE (Metal Organic Vapor Phase Epitaxy) technique is developed, an LED having a desired light emission wavelength belongs to orange, yellow, green, blue and the like other than red can be manufactured.

To obtain high luminance in LED, it is important to emit homogeneously light in a chip. For this purpose, it is required to obtain good current spreading. For achieving the purpose, a manner for increasing a thickness of a current spreading layer (being called by another name of window layer) is known. However, a cost for forming a current spreading layer becomes expensive in view of manufacturing epitaxial wafer for LED use. After all, there is a disadvantage of increasing a cost for manufacturing epitaxial wafer for LED use.

To decrease a manufacturing cost of LED, it is desirable to reduce a thickness of current spreading layer. For this purpose, an epitaxial layer having low resistance is necessary, so that an epitaxial layer having a high carrier concentration is required. In AlGaInP and GaN, however, it is difficult to grow a p-type epitaxial layer having a high carrier concentration. On one hand, another type of semiconductor may be used for fabricating LED so far as the questioned semiconductor has the above-described necessary characteristic properties. Unfortunately, any semiconductor satisfying such required characteristics has not yet been found.

Moreover, it is also known in GaN-based LEDs that a metallic film is used for a current spreading layer. In this case, however, it is required that a thickness of the metallic film is made to be very thin to increase transmittance of light, so that current spreading effect decreases. On the other hand, when enhancement of current spreading effect is intended, a thickness of such metallic film increases inevitably, so that light transmittive property is obstructed, resulting in a restriction of thickness. In addition, a metallic film is usually formed by vacuum evaporation technique. In this case, a prolonged time for evacuation becomes also a problem.

There is an ITO (Indium Tin Oxide) film being a metal oxide film having sufficient light transmittive characteristics and electrical characteristics for obtaining current spreading effect. Furthermore, there is an LED wherein the ITO film is used for a current spreading layer. According to the LED, since no epitaxial layer may be required for a current spreading layer, an LED having high luminance can be inexpensively produced.

(1) An LED Described in Japanese Patent Application Laid-Open No. 2002-344017.

FIG. 1 is a sectional view showing a structure of the LED described in the above Japanese patent application laid-open No. 2002-344017.

This LED 20 is a red LED having an emission wavelength of around 630 nm and which is prepared by lamination of an n-type GaAs substrate 1, an n-type (selenium (Se) doped) $(Al_{0.7}Ga_{0.3})_{0.5}In_{0.5}P$ cladding layer 2, an undoped $(Al_{0.15}Ga_{0.85})_{0.5}In_{0.5}P$ active layer 3, a p-type (Zn doped) $(Al_{0.7}Ga_{0.3})_{0.5}In_{0.5}P$ cladding layer 4 having $5\times10^{17}$ cm$^{-3}$ Zn concentration, a p-type GaP layer 5, a p-type InP layer 6, a transparent conductive film 7, an n-type electrode 8 formed on the whole surface of the bottom of a chip, and a p-type circular electrode 9 having a 150 μm diameter and formed on the top of the LED.

The respective layers extending from the n-type GaAs substrate 1 to the p-type AlGaInP cladding layer 4 are formed by means of MOVPE technique. A growth condition in the MOVPE technique is such that a growth temperature is 700° C., a growth pressure is 50 Torr, a growth rate in the respective layers ranges from 0.3 to 1.0 nm/s, and a V/III ratio ranges from 300 to 600, respectively.

The p-type GaP layer 5 is formed at $1\times10^{18}$ cm$^{-3}$ Zn concentration, 100 V/III ratio, 1 nm/s growth rate and in 2 μm thickness.

The p-type InP layer 6 is formed at $1\times10^{18}$ cm$^{-3}$ Zn concentration and which is provided as an underlying layer of the transparent conductive film 7, functioning to prevent exfoliation of the transparent conductive film 7 from an epitaxial wafer in case of dicing and the like.

The transparent conductive film 7 is made of an ITO film, and which is formed by vacuum evaporation technique. An evaporation condition for the ITO film is such that a substrate temperature is 250° C., an oxygen partial pressure is $4\times10^{-4}$ Torr, and a thickness of about 200 nm.

The n-type electrode 8 is formed by evaporating gold-germanium with 60 nm thickness, nickel with 10 nm thickness, and gold with 500 nm thickness, respectively, in this order.

The p-type electrode 9 is formed by evaporating gold-zinc with 60 nm thickness, nickel with 10 nm thickness, and gold with 1000 nm thickness, respectively, in this order.

The LED 20 is fabricated by cutting out an epitaxial wafer with electrodes used for the LED formed in the above-described structure into 300 μm square chip size according to dicing. In a process for dicing and the like, the transparent conductive film 7 is cut out while maintaining adherence to the p-type InP layer 6. The LED 20 is die-bonded on the TO-18 stem, and the LED 20 is electrically connected to the TO-18 stem by wire-bonding.

According to the above-described conventional LED, however, a junction of the LED having pn junction and the transparent conductive film 7 becomes substantially npn, resulting in an appearance of series resistance due to barrier in the interface of the transparent conductive film 7 and the p-type InP layer 6. In this respect, since the Zn concentration ($1\times10^{18}$ cm$^{-3}$) in the above-described transparent conductive film 7 is insufficient for an amount of reducing series resistance, a high operative voltage is required in light emission. Besides, a thickness (30 nm) for acquiring sufficient current spreading characteristics is required, so that there is a problem of appearing hindrance for attaining high luminance.

(2) Another Conventional LED

On one hand, to solve the above-mentioned problem, there is described a manner for driving an LED based on tunneling current by increasing extremely a carrier concentration of a semiconductor layer located on the uppermost of the LED (see ELECTRONICS LETTERS, 7 Dec. 1995 (pages 2210 to 2212).

Furthermore, there is described a method for fabricating an LED having high luminance, a low operative voltage, and high reliability in such a manner that a GaAs layer to which carbon (C) is added is used as the uppermost semiconductor layer, and carbon tetrabromide ($CBr_4$) is used as a raw material for adding C (see Japanese patent application laid-open No. 1999-307810).

FIG. 2 is a sectional view showing a conventional LED wherein an ITO film is used.

This LED is a red LED having an emission wavelength of around 630 nm and which is prepared by formation of an n-type GaAs substrate 11, an n-type (Se doped) GaAs buffer layer (400 nm thickness, and $1 \times 10^{18}$ $cm^{-3}$ carrier concentration) 12, an n-type (Se doped) $(Al_{0.7}Ga_{0.3})_{0.5}In_{0.5}P$ cladding layer (300 nm thickness, and $1 \times 10^{18}$ $cm^{-3}$ carrier concentration) 13, an undoped $(Al_{0.10}Ga_{0.90})_{0.5}In_{0.5}P$ active layer (600 nm thickness) 14, a p-type (Zn doped) $(Al_{0.7}Ga_{0.3})_{0.5}In_{0.5}P$ cladding layer (300 nm thickness, and $5 \times 10^{17}$ $cm^{-3}$ carrier concentration) 15, a p-type (C doped) GaAs layer (25 nm thickness) 113, an ITO film 17 of a transparent conductive film, a circular p-type electrode 18, and an n-type electrode 19.

The respective layers (except for the ITO film 17, the p-type electrode 18, and the n-type electrode 19) are formed by means of MOVPE technique. A growth condition in the MOVPE technique is such that a growth temperature is 700° C., a growth pressure is 50 Torr, a growth rate in the respective layers ranges from 0.3 to 1.0 nm/s, and a V/III ratio ranges from 300 to 600, respectively.

Raw materials used in the growth according to MOVPE technique include organic metals such as trimethyl gallium (TMG) or triethyl gallium (TEG), trimethyl aluminum (TMA), and trimethyl indium (TMI); and hydride gases such as arsine ($AsH_3$) and phosphine ($PH_3$). Moreover, hydrogen selenide ($H_2Se$) is used as a raw material for adding an additive (additive raw material) to an n-type layer such as the n-type GaAs buffer layer 12.

The ITO film 17 is a metal oxide film to be a current spreading layer, and which is formed in about 230 nm thickness at 300° C. film formation temperature (a surface temperature of the substrate) by means of vacuum evaporation technique. A resistivity is $6.2 \times 10^{-6}$ $\Omega M$ in film formation.

The p-type GaAs layer 113 is formed at a carrier concentration of $1 \times 10^{19}$ $cm^{-3}$, and carbon tetrabromide ($CBr_4$) is used as an additive raw material. Such $CBr_4$ may be used for an additive raw material in another p-type layer. Furthermore, diethylzinc (DEZ) and dimethylzinc (DMZ) may also be used as other additive raw materials in a p-type layer, while silane ($SiH_4$) may be used as an additive raw material for an n-type layer.

The p-type electrode 18 is formed in a matrix shape having 125 µm diameter by evaporating nickel in 20 nm, and gold in 1000 nm, respectively, in this order.

The n-type electrode 19 is formed on the whole surface of the backside of an LED (a surface on which no layer is formed in a semiconductor substrate) in such a manner that gold-germanium in 60 nm, nickel in 10 nm, and gold in 500 nm, respectively, in this order, and then, alloying for electrode is carried out at 400° C. for five minutes in nitrogen gas atmosphere.

However, according to the above-described LED, since adhesion of the p-type GaAs layer 113 of the uppermost layer to the transparent conductive film 17 is not sufficient, there is such a problem that exfoliation appears in the transparent conductive film, resulting in decrease of an yield. Besides, there is also such a disadvantage that sides of the transparent conductive film become irregular, so that a backward voltage becomes low. In the LED shown in FIG. 2, when a condition for measuring the backward voltage is 10 µA and a voltage at that time is −5 V or less, the result is considered to be poor. A light emission output of the LED is 2.50 mW, and a forward operative voltage is 1.98 V at the energization of 20 mA. However, it is confirmed that there is failure due to exfoliation of the ITO film 7 and failure in backward voltage with respect to 20% of the LEDs.

For instance, a manner for inserting an intermediate band gap layer between a GaAs layer and a cladding layer is known for moderating band discontinuity between the GaAs layer and the cladding layer. Even in this manner, however, although a forward voltage can be reduced at a certain degree, deterioration in exfoliation of the transparent conductive film and backward direction characteristics cannot be improved as a matter of course. This is because a layer which is in contact with the transparent conductive film is a GaAs layer. In addition, provision of such intermediate band gap layer between the GaAs layer and the cladding layer increases the cost therefor.

When $CBr_4$ is used as a raw material for adding C, sufficient characteristics can be attained in a first time growth. However, when growth is repeated continually, a light emission output goes down extremely as low as about 50% in a second time growth and thereafter, so that there is a problem of poor reproducibility. For specifying a cause for the problem, the present inventors conducted SIMS analysis on epitaxial wafers grown after the second time growth and thereafter. As a result, it has been found that carbon (C) and oxygen (O) of high concentrations exist in the epitaxial wafers. Based on the fact, it is considered that since raw material $CBr_4$ is used, the high-concentration C and O remain in a growing furnace in the first time growth, and the remained C and O are mixed into epitaxial wafers in the second time growth and thereafter, resulting in decrease in light emission output.

SUMMARY OF THE INVENTION

Accordingly, it is an object of the present invention to provide an LED which does not result in exfoliation of a transparent conductive film, emits light at a low operative voltage, and attains high luminance.

A more specific object of the present invention is to provide an LED which can suppress decrease in an yield due to exfoliation of a transparent conductive film, and reduce a forward operative voltage without providing an intermediate bandgap layer, besides which achieves high luminance, a low operative voltage, a low cost, high reliability, and excellent reproducibility.

In order to achieve the above-described objects, a light emitting diode according to the present invention comprises a semiconductor substrate, a light-emitting region including an active layer provided between a first conductivity type cladding layer formed on the semiconductor substrate and a second conductivity type cladding layer, a transparent conductive film made of a metal oxide and located over the a light-emitting region, a first electrode formed on the upper side of the transparent conductive film, a second electrode formed on the whole or a part of the bottom of the semiconductor substrate, and a layer for preventing exfoliation of the transparent conductive film, the preventing layer being made of a compound semiconductor containing at least aluminum and located between the light-emitting region and the transparent conductive film.

According to the above-described constitution, the provision of the layer for preventing exfoliation of the transparent conductive film containing aluminum results in good adherence to the transparent conductive film, whereby it is possible to prevent exfoliation of the transparent conductive film.

Furthermore, in order to achieve the above-described objects, a light emitting diode according to the present invention comprises a semiconductor substrate, a light-emitting region including an active layer provided between a first conductivity type cladding layer formed on the semiconductor substrate and a second conductivity type cladding layer, a transparent conductive film made of a metal oxide and located over the light-emitting region, a first electrode formed on the upper side of the transparent conductive film, a second electrode formed on the whole or a part of the bottom of the semiconductor substrate, and a layer for preventing exfoliation of the transparent conductive film, the preventing layer being made of a compound semiconductor containing at least aluminum wherein the layer for preventing exfoliation of the transparent conductive film contains a conductivity type determination impurity in a concentration of $1 \times 10^{19}$ cm$^{-3}$ or higher, the layer for preventing exfoliation of the transparent conductive film being located between the light-emitting region and the transparent conductive film.

According to the above-described constitution, the provision of the layer for preventing exfoliation of the transparent conductive film makes possible to prevent exfoliation of the transparent conductive film, besides it is possible to enhance current spreading characteristics to emit light at a low voltage.

Moreover, in order to achieve the above-described objects, a light emitting diode according to the present invention comprises a semiconductor substrate, a light-emitting region including an active layer provided between a first conductivity type cladding layer formed on the semiconductor substrate and a second conductivity type cladding layer, a transparent conductive film made of a metal oxide and located over the light-emitting region, a first electrode formed on the upper side of the transparent conductive film, a second electrode formed on the whole or a part of the bottom of the semiconductor substrate, and an AlGaAs layer having a bandgap energy (called simply "bandgap" hereinafter) which is smaller than that of the active layer, being provided between the light-emitting region and the transparent conductive film wherein the AlGaAs layer is made of $Al_xGa_{1-x}As$ ($0.01 \leq X \leq 0.43$).

According to the above-described constitution, since an additive such as Zn of a high concentration is added to the AlGaAs layer, crystallinity of the AlGaAs decreases. As a result, electricity flows through a defect between the AlGaAs layer and the second conductivity type cladding layer, so that its resistance becomes small. Furthermore, since tunneling effect increases, a resistance in the transparent conductive film and the direct transition AlGaAs as well as the second conductivity type cladding layer decreases, so that a forward operative voltage decreases. Moreover, presence of Al results in good adherence to the transparent conductive film.

In the light emitting diode according to the invention, the layer for preventing exfoliation of the transparent conductive film has a film thickness of 300 nm or less.

In the light emitting diode according to the invention, the transparent conductive film is made of indium tin oxide.

In the light emitting diode according to the invention, the layer for preventing exfoliation of the transparent conductive film is made of an arsenic compound.

In the light emitting diode according to the invention, the light-emitting region is made of $(Al_xGa_{1-x})_YIn_{1-Y}P$ ($0 \leq X \leq 1$, $0 \leq Y \leq 1$).

In the light emitting diode according to the invention, the AlGaAs layer has a carrier concentration of $1 \times 10^{19}$ cm$^{-3}$ or higher.

In the light emitting diode according to the invention, the AlGaAs layer is added with at least one of Zn, Be, and Mg.

In the light emitting diode according to the invention, the AlGaAs layer is added with at least one of Zn, Be and Mg, and C, and C is autodoped.

In the light emitting diode according to the invention, the AlGaAs layer is formed at a growth temperature of 600° C. or lower.

In the light emitting diode according to the invention, the AlGaAs layer is formed at a V/III ratio in raw materials of 50 or less at the time of growth.

In the light emitting diode according to the invention, the transparent conductive film is made of indium tin oxide.

BRIEF DESCRIPTION OF THE DRAWINGS

The present invention will be explained in more detail in conjunction with appended drawings, wherein.

DESCRIPTION OF THE PREFERRED EMBODIMENTS

Preferred embodiments of the present invention will be described in detail hereinafter by referring to the accompanying drawings.

First Embodiment

Figure 1:
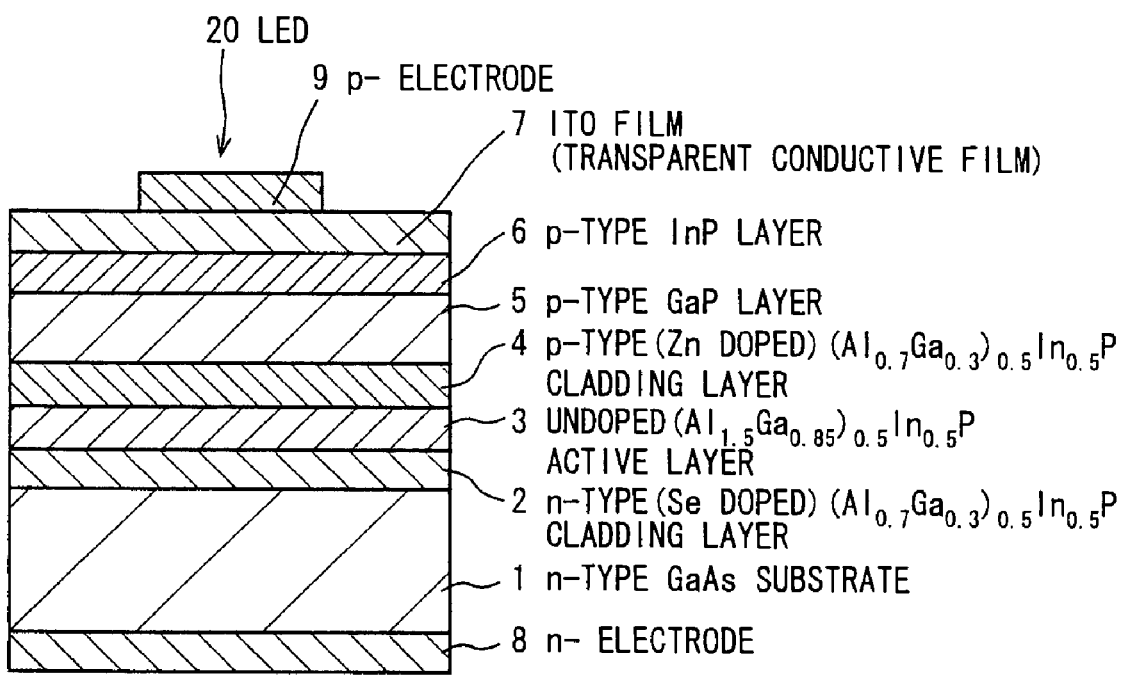
FIG. 1 is a sectional view showing a conventional light emitting diode.
Figure 2:
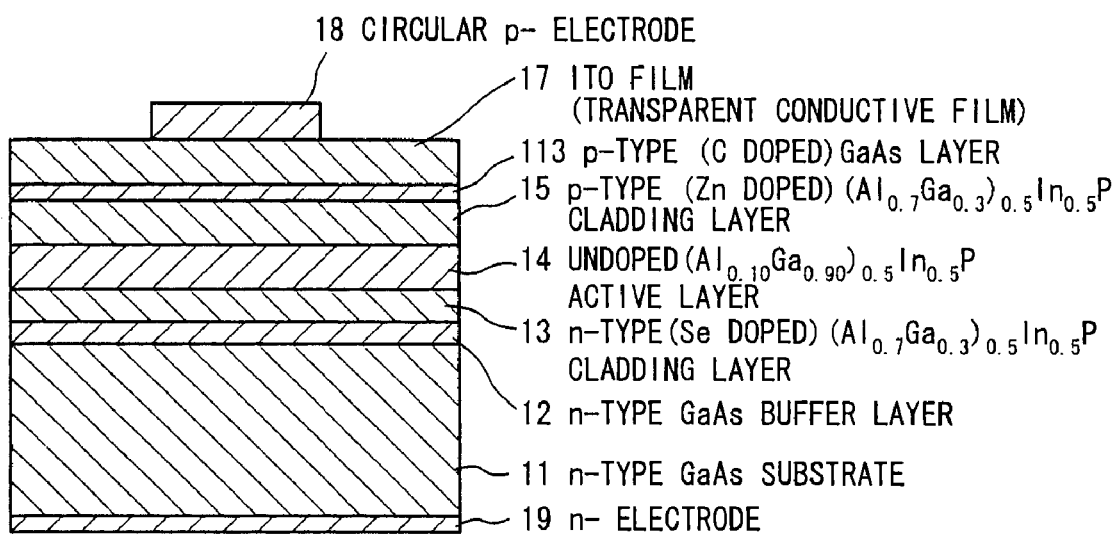
FIG. 2 is a sectional view showing a conventional light emitting diode wherein an ITO film is used.
Figure 3:
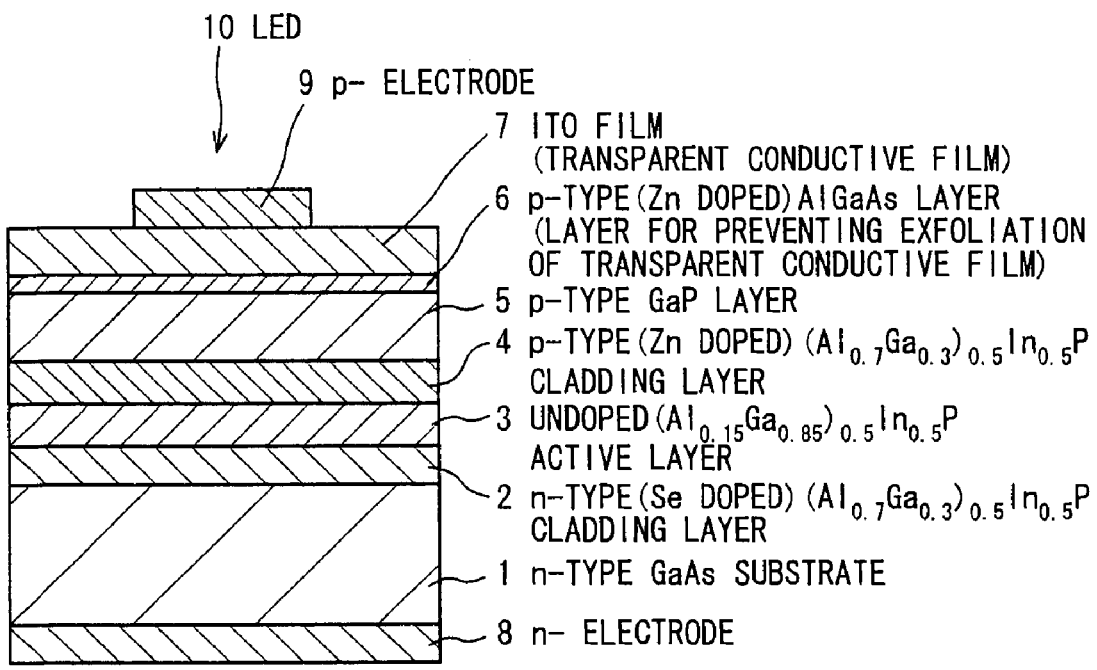
FIG. 3 is a sectional view showing a light emitting diode according to a first embodiment of the present invention.

FIG. 3 is a sectional view showing an LED 10 according to the first embodiment of the present invention. The LED 10 is a red LED having an emission wavelength of around 630 nm and which is prepared by lamination of an n-type GaAs substrate 1, an n-type (Se doped) $(Al_{0.7}Ga_{0.3})_{0.5}In_{0.5}P$ cladding layer 2, an undoped $(Al_{0.15}Ga_{0.85})_{0.5}In_{0.5}P$ active layer 3, a p-type (Zn doped) $(Al_{0.7}Ga_{0.3})_{0.5}In_{0.5}P$ cladding layer 4 having a Zn concentration of $5 \times 10^{17}$ cm$^{-3}$, a p-type GaP layer 5, a p-type (Zn doped) AlGaAs layer 6 being a layer for preventing exfoliation of a transparent conductive film, the transparent conductive film 7 made of an ITO film, an n-type electrode 8 formed on the whole backside of the n-type GaAs substrate 1, and a circular p-type electrode 9 having 150 μm diameter formed on the surface side of the transparent conductive film 7. In this case, the epitaxial growth method, the epitaxial structure, the method for forming an ITO film and the like are the same as those described in FIG. 1 relating to the LED 20.

The p-type AlGaAs layer 6 is formed on the p-type GaP layer 5 in 10 nm thickness so as to have $1 \times 10^{19}$ cm$^{-3}$ or higher Zn concentration wherein an Al composition of the AlGaAs is varied to be 0.1, 0.4, and 0.8, respectively.

The LED 10 is obtained by cutting an epitaxial wafer with electrodes used for an LED which is laminated to have the above-described structure into a chip size of 300 μm square by means of dicing. In a process for dicing or the like, the transparent conductive film 7 is cut out while maintaining adherence to the p-type AlGaAs layer 6. The cut and processed LED 10 is die-bonded on a TO-18 stem, and the die-bonded LED 10 is electrically connected to the TO-18 stem by means of wire bonding.

According to the above-described LED 10, it is confirmed that an exfoliation phenomenon in the transparent conductive film 7 is about 1% or less in all the LED chips wherein each Al composition is changed. When the p-type AlGaAs layer 6 is used for a semiconductor layer being in contact with the transparent conductive film 7 as a layer containing at least Al, the exfoliation phenomenon can be suppressed, whereby a yield for fabricating such LED can be remarkably increased.

Furthermore, since a thickness of the p-type AlGaAs layer 6 can be thinned as thin as 10 nm, light extraction of the LED is enhanced, resulting in high luminance and reduction in an amount of raw materials consumed, whereby manufacturing cost can be reduced.

An exfoliation phenomenon of the transparent conductive film 7 from a semiconductor layer depends remarkably on an aluminum (Al) composition in its compound semiconductor. According to the present invention, it has been found that when the compound semiconductor contains at least Al, it is suppressed to exfoliate the transparent conductive film 7 from the semiconductor layer. More specifically, an Al composition of a layer for preventing exfoliation of the transparent conductive film is required to be at least 0.01, so that a compound semiconductor which does not contain Al such as $Ga_X In_{1-X} P$ ($0 \leq X \leq 1$), and $Ga_X In_{1-X} As$ ($0 \leq X \leq 1$) is not suitable.

Moreover, the transparent conductive film 7 described in the first embodiment is an n-type metal oxide, so that junction of which to an LED having pn junction brings about substantially npn junction, resulting in appearance of series resistance due to a barrier in an interface between the transparent conductive film 7 and the p-type AlGaAs layer 6. In order to solve or moderate the above-described problem, a high carrier concentration, and more specifically, a high impurity concentration is required for the p-type AlGaAs layer 6. Accordingly, it is desired that a conductivity type determination impurity concentration, i.e. a Zn concentration contained in the p-type AlGaAs layer 6 is $1 \times 10^{19}$ cm$^{-3}$ or more.

In the above-described first embodiment, a quaternary LED such as $(Al_X Ga_{1-X})_Y In_{1-Y} P$ ($0 \leq X \leq 1$, $0 \leq Y \leq 1$) is described. However, for example, when the above-described layer for preventing exfoliation of the transparent conductive film is provided in a ternary LED such as AlGaAs, an exfoliation phenomenon of such transparent conductive film can be suppressed.

Besides, for example, a light reflection layer such as a distributed Bragg reflection layer (DBR) may be disposed between a GaAs substrate and an n-type cladding layer in order to intend high luminance of LED.

Second Embodiment

In the second embodiment of the present invention, a red LED having an emission wavelength of around 630 nm is prepared in such that p-type (Zn doped) AlInAs layer is formed on a p-type GaP layer in 10 nm thickness as a layer for preventing exfoliation of the transparent conductive film, and an Al composition contained in the AlInAs is made to be 0.1, 0.4, and 0.8, respectively. The other structures, the epitaxial growth method, the epitaxial structures, the ITO film forming method and the like are the same as those of the first embodiment, so that overlapped description is omitted.

Furthermore, an LED is fabricated by cutting an epitaxial wafer including the above-described p-type AlInAs layer into a chip size of 300 μm square by means of dicing as in the first embodiment. In the process for dicing or the like, the transparent conductive film is cut out while maintaining adherence to the p-type AlInAs layer. The cut and processed LED is die-bonded on a TO-18 stem, and the die-bonded LED is electrically connected to the TO-18 stem by means of wire bonding.

According to the above-described LEDs of the second embodiment, it is confirmed as in the first embodiment that an exfoliation phenomenon in the transparent conductive film is about 1% or less in all the LED chips wherein each Al composition is changed in also the case where the AlInAs layer is used, so that an yield for fabricating LED can be remarkably increased.

Third Embodiment

In the third embodiment of the present invention, a red LED having an emission wavelength of around 630 nm is prepared in such that p-type (Zn doped) AlGaInAs layer is formed on a p-type GaP layer in 10 nm thickness as a layer for preventing exfoliation of the transparent conductive film, and an Al composition contained in the AlGaInAs is made to be 0.1, 0.4, and 0.8, respectively. The other structures, the epitaxial growth method, the epitaxial structures, the ITO film forming method and the like are the same as those of the first embodiment, so that overlapped description is omitted.

Furthermore, an LED is fabricated by cutting an epitaxial wafer including the above-described p-type AlGaInAs layer into a chip size of 300 μm square by means of dicing as in the first and the second embodiments. In a process for dicing or the like, the transparent conductive film is cut out while maintaining adherence to the p-type AlGaInAs layer. The cut and processed LED is die-bonded on a TO-18 stem, and the die-bonded LED is electrically connected to the TO-18 stem by means of wire bonding.

According to the above-described LEDs of the third embodiment, it is confirmed as in the first embodiment that an exfoliation phenomenon in the transparent conductive film is about 1% or less in all the LED chips wherein each Al composition is changed in also the case where the AlGaInAs layer is used, so that an yield for fabricating LED can be remarkably increased.

As described above, since a layer for preventing exfoliation of the transparent conductive film which is made of a compound semiconductor containing at least Al and contains a conductivity type determination impurity of $1 \times 10^{19}$ cm$^{-3}$ or higher concentration is provided as a semiconductor layer being in contact with the transparent conductive film 7 in the LEDs according to the present invention, the transparent conductive film does not exfoliate due to dicing or the like treatment, and each of the resulting LEDs emits at a low operative voltage, whereby high luminance can be achieved.

Fourth Embodiment

Figure 4:
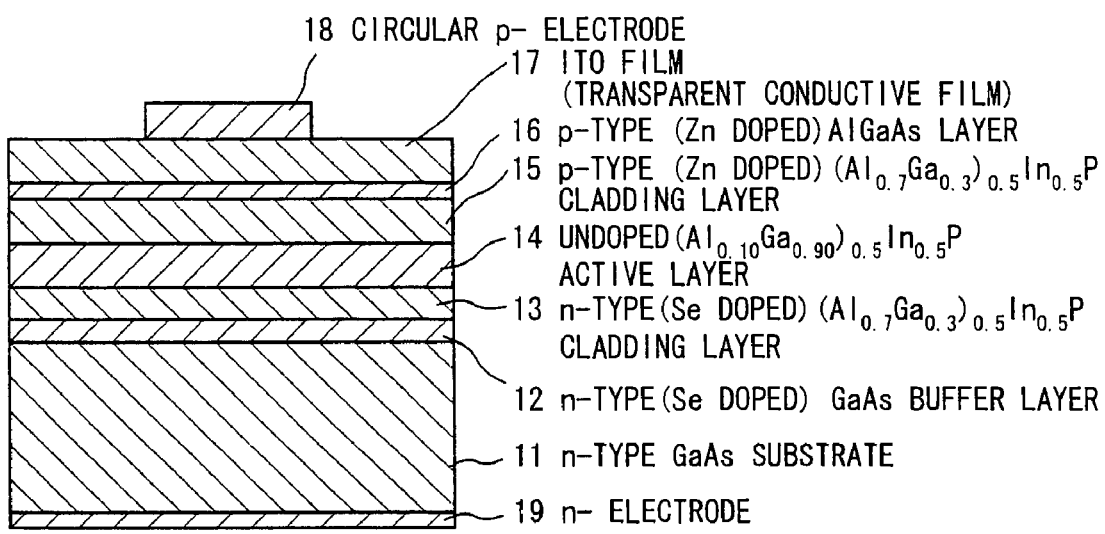
FIG. 4 is a sectional vies showing a light emitting diode according to a fourth embodiment of the present invention.

FIG. 4 is a sectional view showing an LED according to the fourth embodiment of the present invention.

The LED is a red LED having an emission wavelength of around 630 nm and which is prepared by lamination of an n-type GaAs substrate 11, an n-type (Se doped) GaAs buffer layer (400 nm thickness, $1\times10^{18}$ cm$^{-3}$ carrier concentration) 12, an n-type (Se doped) $(Al_{0.7}Ga_{0.3})_{0.5}In_{0.5}P$ cladding layer (300 nm thickness, $1\times10^{18}$ cm$^{-3}$ carrier concentration) 13, an An epitaxial wafer with electrodes for LED use which is laminated with the above-described constitution is cut out into a chip size of 300 μm square in such that the p-type electrode 18 is positioned at the center to obtain a LED bare chip. The resulting LED bare chip is die-bonded on a TO-18 stem, and the die-bonded LED bare chip is electrically connected to the TO-18 stem by means of wire bonding.

In the following, results evaluated as to the LEDs of the fourth embodiment are shown in TABLE 1.

TABLE 1

| Thickness (nm) | Emission Output (mW) | | | | | | | | | | | | Vf (V) | Percent Defective (%) |
|---|---|---|---|---|---|---|---|---|---|---|---|---|---|---|
| | 5 | 10 | 15 | 20 | 25 | 30 | 35 | 40 | 45 | 50 | 75 | 100 | | |
| Al0.01GaAs | 3.12 | 2.98 | 2.83 | 2.70 | 2.58 | 2.50 | | | | | | | 1.92 | 1%≧ |
| Al0.05GaAs | 3.13 | 2.99 | 2.86 | 2.73 | 2.62 | 2.54 | 2.48 | | | | | | 1.95 | 1%≧ |
| Al0.10GaAs | 3.14 | 3.02 | 2.89 | 2.77 | 2.66 | 2.58 | 2.52 | 2.49 | | | | | 1.93 | 1%≧ |
| Al0.15GaAs | 3.16 | 3.05 | 2.93 | 2.82 | 2.72 | 2.65 | 2.59 | 2.56 | 2.54 | 2.54 | 2.58 | | 1.94 | 1%≧ |
| Al0.20GaAs | 3.17 | 3.07 | 2.96 | 2.86 | 2.78 | 2.70 | 2.65 | 2.62 | 2.61 | 2.61 | 2.65 | | 1.98 | 1%≧ |
| Al0.25GaAs | 3.18 | 3.09 | 3.00 | 2.91 | 2.82 | 2.76 | 2.71 | 2.67 | 2.66 | 2.67 | 2.72 | 2.47 | 1.92 | 1%≧ |
| Al0.30GaAs | 3.19 | 3.11 | 3.03 | 2.94 | 2.87 | 2.81 | 2.76 | 2.73 | 2.72 | 2.72 | 2.78 | 2.57 | 1.95 | 1%≧ |
| Al0.35GaAs | 3.20 | 3.13 | 3.06 | 2.98 | 2.92 | 2.86 | 2.81 | 2.79 | 2.78 | 2.78 | 2.85 | 2.67 | 1.95 | 1%≧ |
| Al0.40GaAs | 3.22 | 3.18 | 3.12 | 3.06 | 3.00 | 2.95 | 2.92 | 2.90 | 2.89 | 2.90 | 3.03 | 2.93 | 2.00 | 1%≧ |
| Al0.43GaAs | 3.24 | 3.22 | 3.19 | 3.16 | 3.13 | 3.09 | 3.07 | 3.06 | 3.05 | 3.06 | 3.19 | 3.20 | 1.98 | 1%≧ |
| Al0.45GaAs | | | | | 3.17 | | | | | | | | 2.05 | 1%≧ | undoped $(Al_{0.10}Ga_{0.90})_{0.5}In_{0.5}P$ active layer (600 nm thickness) 14, a p-type (Zn doped) $(Al_{0.7}Ga_{0.3})_{0.5}In_{0.5}P$ cladding layer (300 nm thickness, $5\times10^{17}$ cm$^{-3}$ carrier concentration) 15, a p-type (Zn doped) AlGaAs layer ($1\times10^{19}$ cm$^{-3}$ carrier concentration) 16 formed at 600° C. growth temperature and in a V/III ratio of 50, an ITO film 17 of a transparent conductive film, a circular p-type electrode 18, and an n-type electrode 19.

Multiple quantum well may be used in the active layer 14.

The respective layers (except for the ITO film 17, the p-type electrode 18, and the n-type electrode 19) are formed by means of MOVPE (Metal Organic Vapor Phase Epitaxy) technique wherein a growth temperature is 700° C., a growth pressure is 50 Torr, a growth rate in the respective layers ranges from 0.3 to 1.0 nm/s, and a V/III ratio is 300 to 600, respectively. Raw materials used in the growth according to MOVPE technique include, for example, organic metals such as trimethyl gallium (TMG) or triethyl gallium (TEG), trimethyl aluminum (TMA), and trimethyl indium (TMI), and hydride gases such as arsine ($AsH_3$), and phosphine ($PH_3$). Furthermore, hydrogen selenide ($H_2Se$) is used as an additive raw material for an n-type layer such as the n-type GaAs buffer layer 12.

The n-type cladding layer 13, the active layer 14, and the p-type cladding layer 15 constitute a light-emitting region made of $(Al_XGa_{1-X})_YIn_{1-Y}P$ ($0 \leq X \leq 1$, $0 \leq Y \leq 1$).

The ITO film 17 is a metal oxide functioning as a current spreading layer which is formed in about 230 nm thickness at a film formation temperature (a surface temperature of substrate) of 300° C. by means of vacuum evaporation. A resistivity of the ITO film at the time of film formation is $6.2\times10^{-6}$ Ωm.

The p-type electrode 18 is obtained by evaporating nickel and gold in this order with a thickness of 20 nm and 1000 nm, respectively, and a diameter of which is 125 μm and formed in a matrix shape.

The n-type electrode 19 is formed on the whole surface of the backside of the n-type GaAs substrate 11 by evaporating gold-germanium, nickel, and gold in this order with a thickness of 60 nm, 10 nm, and 500 nm, respectively, and then, the electrode is alloyed in nitrogen gas atmosphere of 400° C. for five minutes.

According to each of the LEDs of the above-described fourth embodiment, since a direct transition AlGaAs layer made of $Al_XGa_{1-X}As$ ($0.01 \leq X \leq 0.43$) is provided between the p-type AlGaInP cladding layer 15 and the ITO film 17, high output of 3.12 mw is obtained in even 5 nm thickness of the AlGaAs layer as is apparent from TABLE 1. Besides, a low operative voltage and a low cost can be attained. In addition, the LEDs can be manufactured in good yields. As a result of reliability test under the test condition of 55° C. temperature and 50 mA electric conduction with respect to an LED element which is used for LED before sealing with a resin, it is confirmed that the LED element exhibits such high reliability that all the relative outputs (emission output before electric conduction/emission output after electric conduction) after 24 hour electric conduction are 90% or more (an electric current value is 20 mA at the time of estimating output).

In the above-described fourth embodiment, although the p-type electrode 18 has been formed into a circular shape, the same effects are obtained also in a polygonal shape such as square, and rhombi. Moreover, the same effects are attained also in a structure wherein the active layer is undoped, or made to have second conductivity type or first conductivity type.

Furthermore, the same effects are also achieved by providing a light reflection layer (DBR) between the n-type buffer layer 12 and the n-type cladding layer 13, and the same results are obtained without forming the n-type buffer layer 12.

Fifth Embodiment

In the fifth embodiment of the present invention, a yellow LED having 590 nm emission wavelength wherein an undoped $(Al_{0.32}Ga_{0.86})_{0.5}In_{0.5}P$ active layer is provided for an active layer 14 of 600 nm thickness is fabricated. The structures, the epitaxial growth method, and the thicknesses of epitaxial layers in the other parts are the same as those described in the LEDs of the fourth embodiment, so that overlapped description is omitted.

In the following results evaluated as to the LEDs of the fifth embodiment are shown in TABLE 2.

TABLE 2

| Thickness (nm) | Emission Output (mW) | | | | | | | | | | | | Vf (V) | Percent Defective (%) |
|---|---|---|---|---|---|---|---|---|---|---|---|---|---|---|
| | 5 | 10 | 15 | 20 | 25 | 30 | 35 | 40 | 45 | 50 | 75 | 100 | | |
| Al0.01GaAs | 1.18 | 1.11 | 1.05 | 1.00 | 0.95 | | | | | | | | 1.94 | 1%≧ |
| Al0.05GaAs | 1.18 | 1.12 | 1.06 | 1.01 | 0.97 | 0.94 | | | | | | | 1.95 | 1%≧ |
| Al0.10GaAs | 1.18 | 1.13 | 1.07 | 1.02 | 0.98 | 0.95 | | | | | | | 1.93 | 1%≧ |
| Al0.15GaAs | 1.19 | 1.13 | 1.08 | 1.04 | 1.00 | 0.97 | 0.95 | | | | | | 1.98 | 1%≧ |
| Al0.20GaAs | 1.19 | 1.14 | 1.10 | 1.05 | 1.02 | 0.99 | 0.97 | 0.96 | 0.96 | 0.96 | | | 1.95 | 1%≧ |
| Al0.25GaAs | 1.20 | 1.15 | 1.11 | 1.07 | 1.04 | 1.02 | 1.00 | 0.99 | 0.99 | 0.99 | 0.96 | | 1.93 | 1%≧ |
| Al0.30GaAs | 1.20 | 1.16 | 1.13 | 1.09 | 1.06 | 1.04 | 1.02 | 1.02 | 1.01 | 1.01 | 0.99 | | 1.96 | 1%≧ |
| Al0.35GaAs | 1.21 | 1.17 | 1.14 | 1.11 | 1.08 | 1.06 | 1.05 | 1.04 | 1.03 | 1.03 | 1.02 | | 1.95 | 1%≧ |
| Al0.40GaAs | 1.21 | 1.18 | 1.15 | 1.12 | 1.10 | 1.08 | 1.07 | 1.06 | 1.06 | 1.06 | 1.04 | | 2.02 | 1%≧ |
| Al0.43GaAs | 1.21 | 1.19 | 1.16 | 1.14 | 1.12 | 1.10 | 1.09 | 1.08 | 1.08 | 1.08 | 1.07 | | 2.01 | 1%≧ |
| Al0.45GaAs | | | | 1.14 | | | | | | | | | 2.06 | 1%≧ |

According to the LEDs of the above-described fifth embodiment, each of the yellow LEDs exhibits a high output, and a low operative voltage. Further, a low cost can be achieved on the basis of desirable characteristic property of the fourth embodiment, besides the LEDs are fabricated in good yields.

Sixth Embodiment

In the sixth embodiment of the present invention, a green LED having 560 nm emission wavelength wherein an undoped $(Al_{0.46}Ga_{0.54})_{0.5}In_{0.5}P$ active layer (600 nm thickness) is provided for an active layer 14 is fabricated. The structures, the epitaxial growth method, and the thicknesses of epitaxial layers in the other parts are the same as those described in the LEDs of the fourth and the fifth embodiments, so that overlapped description is omitted.

In the following results evaluated as to the LEDs of the sixth embodiment are shown in TABLE 3.

(1) This LED is a red LED of around 630 nm emission wavelength includes an undoped $(Al_{0.7}Ga_{0.3})_{0.5}In_{0.5}P$ layer (300 nm thickness) 110 provided between an AlGaInP active layer and a p-type AlGaInP cladding layer 15. The structures, the epitaxial growth method, and the thicknesses of epitaxial layers in the other parts are the same as those described in the LEDs of the fourth through the sixth embodiments, so that overlapped description is omitted.

(2) Furthermore, another LED including a low carrier concentration p-type (Zn doped) $(Al_{0.7}Ga_{0.3})_{0.5}In_{0.5}P$ layer (300 nm thickness, $1\times10^{17}$ cm$^{-3}$ carrier concentration) 110 to be formed between the AlGaInP active layer 14 and the p-type AlGaInP cladding layer 15 is fabricated at the same time of the fabrication of the LED defined in the paragraph (1). The other structures and the like are the same as those of the LED in (1).

(3) Moreover, a further LED including a low carrier concentration n-type (Se doped) $(Al_{0.7}Ga_{0.3})_{0.5}In_{0.5}P$ layer (300 nm thickness, $1\times10^{17}$ cm$^{-3}$ carrier concentration) 110 to be

TABLE 3

| Thickness (nm) | Emission Output (mW) | | | | | | | | | | | | Vf (V) | Percent Defective (%) |
|---|---|---|---|---|---|---|---|---|---|---|---|---|---|---|
| | 5 | 10 | 15 | 20 | 25 | 30 | 35 | 40 | 45 | 50 | 75 | 100 | | |
| Al0.01GaAs | 0.21 | 0.20 | 0.18 | 0.17 | 0.17 | | | | | | | | 2.10 | 1%≧ |
| Al0.05GaAs | 0.21 | 0.20 | 0.19 | 0.18 | 0.17 | | | | | | | | 2.15 | 1%≧ |
| Al0.10GaAs | 0.21 | 0.20 | 0.19 | 0.18 | 0.17 | 0.17 | | | | | | | 2.08 | 1%≧ |
| Al0.15GaAs | 0.21 | 0.20 | 0.19 | 0.18 | 0.17 | 0.17 | 0.17 | | | | | | 2.09 | 1%≧ |
| Al0.20GaAs | 0.21 | 0.20 | 0.19 | 0.18 | 0.18 | 0.17 | 0.17 | 0.17 | 0.17 | 0.17 | | | 2.13 | 1%≧ |
| Al0.25GaAs | 0.21 | 0.20 | 0.19 | 0.19 | 0.18 | 0.18 | 0.17 | 0.17 | 0.17 | 0.17 | | | 2.13 | 1%≧ |
| Al0.30GaAs | 0.21 | 0.20 | 0.20 | 0.19 | 0.18 | 0.18 | 0.18 | 0.18 | 0.18 | 0.17 | | | 2.14 | 1%≧ |
| Al0.35GaAs | 0.21 | 0.21 | 0.20 | 0.19 | 0.19 | 0.18 | 0.18 | 0.18 | 0.18 | 0.18 | 0.17 | | 2.11 | 1%≧ |
| Al0.40GaAs | 0.22 | 0.21 | 0.20 | 0.20 | 0.19 | 0.19 | 0.19 | 0.19 | 0.19 | 0.18 | 0.17 | | 2.12 | 1%≧ |
| Al0.43GaAs | 0.22 | 0.21 | 0.20 | 0.20 | 0.20 | 0.19 | 0.19 | 0.19 | 0.19 | 0.19 | 0.18 | | 2.19 | 1%≧ |
| Al0.45GaAs | | | | | 0.20 | | | | | | | | 2.20 | 1%≧ |

According to the LEDs of the above-described sixth embodiment, each of the green LEDs exhibits a high output, and a low operative voltage. Further, a low cost can be achieved on the basis of desirable characteristic property of the fourth embodiment, besides the LEDs are fabricated in good yields.

Seventh Embodiment

Figure 5:
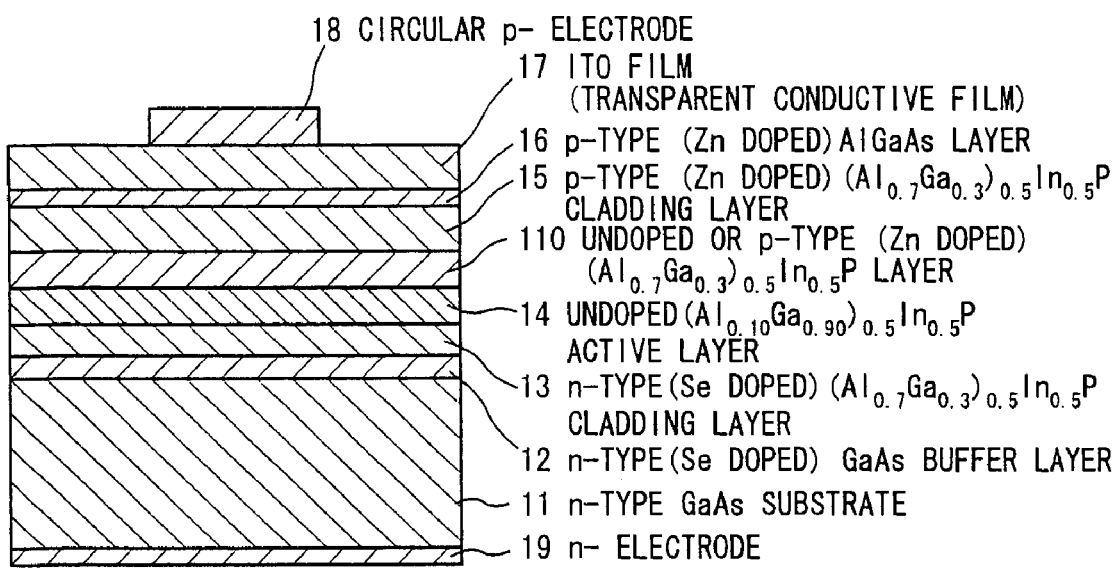
FIG. 5 is a sectional view showing a light emitting diode according to a seventh embodiment of the present invention.

FIG. 5 is a sectional view showing an LED according to the seventh embodiment of the present invention.

formed between the AlGaInP active layer 14 and the p-type AlGaInP cladding layer 15 is fabricated at the same time of the fabrication of the LED defined in the paragraph (1). The other structures and the like are the same as those of the LED in (1).

Characteristic properties of the LEDs thus fabricated were evaluated. The properties of the LEDs in (1), (2), and (3) were (1): 2.71 mW, (2): 2.63 mW, and (3): 2.61 mW; and their forward operative voltages were (1): 1.96 V, (2): 1.93 V, and (3): 1.97 V, respectively.

The above-described LEDs of the seventh embodiment exhibit good properties as those in the LEDs of the fourth embodiment. In addition, relative outputs as to reliability are enhanced to 95 to 99%, and it is confirmed that the same yields as that of the fourth embodiment are attained.

Eighth Embodiment

Figure 6:
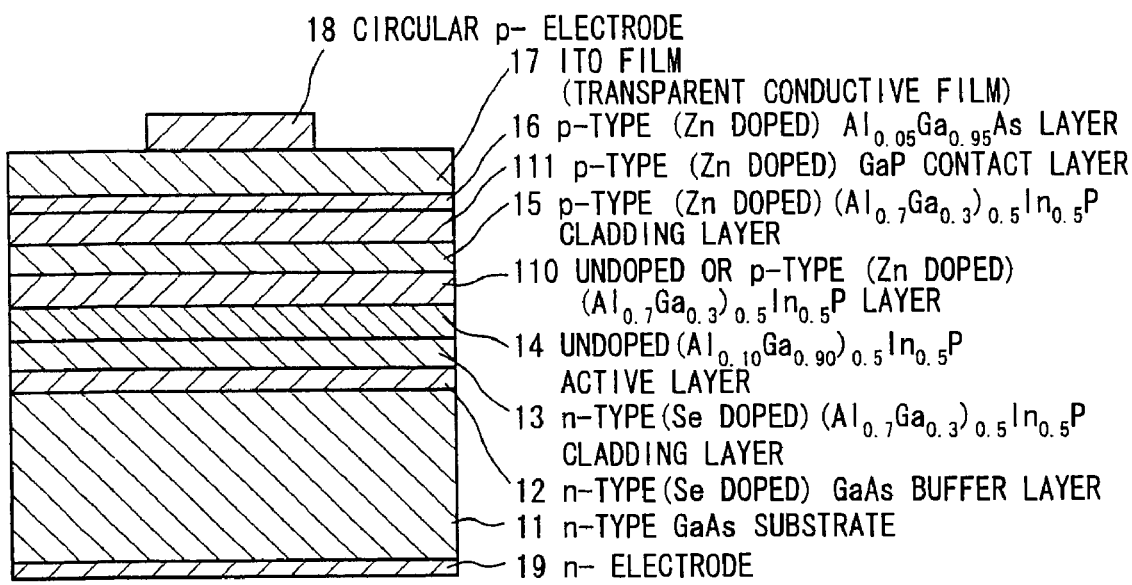
FIG. 6 is a sectional view showing a light emitting diode according to an eighth embodiment of the present invention.

FIG. 6 is a sectional view showing an LED according to the eighth embodiment of the present invention.

(1) This LED is a red LED having an emission wavelength of around 630 nm and which is prepared by lamination of an n-type GaAs substrate 11, an n-type (Se doped) GaAs buffer layer (400 nm thickness, $1\times10^{18}$ cm$^{-3}$ carrier concentration) 12, an n-type (Se doped) $(Al_{0.7}Ga_{0.3})_{0.5}In_{0.5}P$ cladding layer (300 nm thickness, $1\times10^{18}$ cm$^{-3}$ carrier concentration) 13, an undoped $(Al_{0.10}Ga_{0.90})_{05}In_{0.5}P$ active layer (600 nm thickness) 14, an undoped $(Al_{0.7}Ga_{0.3})_{0.5}In_{0.5}P$ layer (300 nm thickness) 110, a p-type (Zn doped) $(Al_{0.7}Ga_{0.3})_{0.5}In_{0.5}P$ cladding layer (300 nm thickness, $5\times10^{17}$ cm$^{-3}$ carrier concentration) 15, a p-type (Zn doped) GaP contact layer (200 nm thickness, $5\times10^{18}$ cm$^{-3}$ carrier concentration) 111, a p-type (Zn doped) $Al_{0.05}Ga_{0.95}As$ layer (25 nm thickness, $1\times10^{19}$ cm$^{-3}$ carrier concentration) 16, an ITO film ($6.3\times10^{-6}$ Ωm resistivity) 17 of a transparent conductive film, a circular p-type electrode 18, and an n-type electrode 19. In the following description, an explanation as to the same contents as those of the fourth through seventh embodiments is omitted.

(2) Furthermore, another LED including a p-type $(Al_{0.7}Ga_{0.3})_{0.5}In_{0.5}P$ contact layer 111 is fabricated at the same time of the fabrication of the LED in the above paragraph (1). The other structures and the like are the same as those of the LED in (1).

(3) Moreover, a further LED including a p-type $Al_{0.85}Ga_{0.15}As$ contact layer 111 is fabricated at the same time of the fabrication of the LED in the above paragraph (1). The other structures and the like are the same as those of the LED in (1).

In the following, results evaluated as to the LEDs of the eighth embodiment are shown in TABLE 4.

TABLE 4

| Contact Layer 111 | Emission Output (mW) | Forward Operative Voltage (V) | Relative Output (%) | Percent Defective (%) |
|---|---|---|---|---|
| GaP | 2.65 | 1.96 | 93 | 1≧ |
| AlGaAs | 2.62 | 1.94 | 95 | 1≧ |
| AlGaInP | 2.61 | 1.95 | 92 | 1≧ |

All the LEDs of the above-described eighth embodiment exhibit substantially the same results as those of the fourth embodiment (TABLE 1) as is apparent from TABLE 4. Besides, the yields are also equivalent to those of the fourth embodiment, and reliability is good, since a relative output is 95% or higher.

Ninth Embodiment

Figure 7:
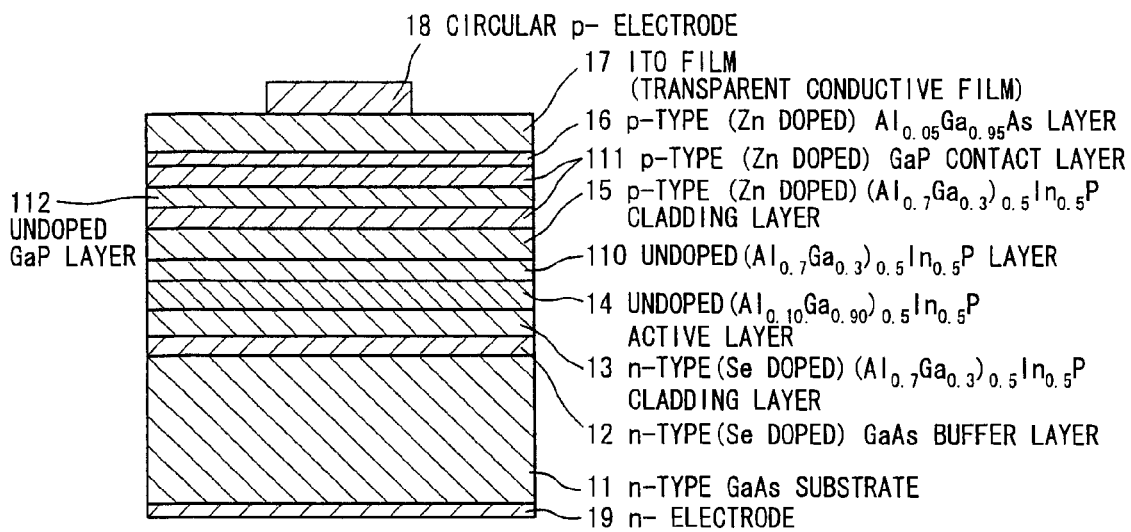
FIG. 7 is a sectional view showing a ninth embodiment of the present invention.

FIG. 7 is a sectional view showing an LED according to the ninth embodiment of the present invention.

(1) This LED is a red LED having an emission wavelength of around 630 nm and which is prepared by lamination of an n-type GaAs substrate 11, an n-type (Se doped) GaAs buffer layer (400 nm thickness, $1\times10^{18}$ cm$^{-3}$ carrier concentration) 12, an n-type (Se doped) $(Al_{0.7}Ga_{0.3})_{0.5}In_{0.5}P$ cladding layer (300 nm thickness, $1\times10^{18}$ cm$^{-3}$ carrier concentration) 13, an undoped $(Al_{0.10}Ga_{0.90})_{05}In_{0.5}P$ active layer (600 nm thickness) 14, an undoped $(Al_{0.7}Ga_{0.3})_{0.5}In_{0.5}P$ layer (300 nm thickness) 110, a p-type (Zn doped) $(Al_{0.7}Ga_{0.3})_{0.5}In_{0.5}P$ cladding layer (300 nm thickness, $5\times10^{17}$ cm$^{-3}$ carrier concentration) 15, a p-type (Zn doped) GaP contact layer (150 nm thickness, $5\times10^{18}$ cm$^{-3}$ carrier concentration) 111, an undoped GaP layer (200 nm thickness) 112, a p-type (Zn doped) GaP contact layer (150 nm thickness, $5\times10^{18}$ cm$^{-3}$ carrier concentration) 111, a p-type (Zn doped) $Al_{0.05}Ga_{0.95}As$ layer (25 nm thickness, $1\times10^{19}$ cm$^{-3}$ carrier concentration) 16, an ITO film ($6.1\times10^{-6}$ Ωm resistivity) 17 of a transparent conductive film, a circular p-type electrode 18, and an n-type electrode 19. In the following description, an explanation relating to the same contents as those of the fourth through the eighth embodiments is omitted.

(2) Furthermore, another LED including a p-type $(Al_{0.7}Ga_{0.3})_{0.5}In_{0.5}P$ contact layer 111 is fabricated at the same time of the fabrication of the LED in the above paragraph (1). The other structures and the like are the same as those of the LED in (1).

(3) Moreover, a further LED including a p-type $Al_{0.85}Ga_{0.15}As$ contact layer 111 is fabricated at the same time of the fabrication of the LED in the above paragraph (1). The other structures and the like are the same as those of the LED in (1).

(4) A still further LED including an undoped $(Al_{0.7}Ga_{0.3})_{0.5}In_{0.5}P$ layer 112 is fabricated at the same time of the fabrication of the LED in the above paragraph (1). The other structures and the like are the same as those of the LED in (1).

(5) An yet further LED including an undoped $Al_{0.85}Ga_{0.15}As$ layer 112 is fabricated at the same time of the fabrication of the LED in the above paragraph (1). The other structures and the like are the same as those of the LED in (1).

In the following, results evaluated as to the LEDs of the ninth embodiment are shown in TABLE 5.

TABLE 5

| Contact Layer 111 | Undoped Layer 112 | Emission Output (mW) | Forward Operative Voltage (V) | Relative Output (%) | Percent Defective (%) |
|---|---|---|---|---|---|
| GaP | GaP | 2.65 | 1.96 | 95 | 1≧ |
| | AlGaAs | 2.64 | 1.94 | 97 | 1≧ |
| | AlGaInP | 2.62 | 1.95 | 95 | 1≧ |
| AlGaAs | GaP | 2.63 | 1.93 | 93 | 1≧ |
| | AlGaAs | 2.62 | 1.92 | 93 | 1≧ |
| | AlGaInP | 2.61 | 1.94 | 91 | 1≧ |
| AlGaInP | GaP | 2.63 | 1.95 | 94 | 1≧ |
| | AlGaAs | 2.61 | 1.95 | 96 | 1≧ |
| | AlGaInP | 2.62 | 1.96 | 95 | 1≧ |

All the LEDs of the above-described ninth embodiment are equal to or better than the results of the seventh embodiment in respect of light emission property and reliability as is apparent from TABLE 5. Besides, the yields are also good and equivalent to those of the seventh embodiment. Moreover, since each of the resulting LEDs has such constitution as described above, negative resistance is eliminated, and it is possible to form an LED which is not damaged, even when significant voltage variation occurs.

Tenth Embodiment

Figure 8:
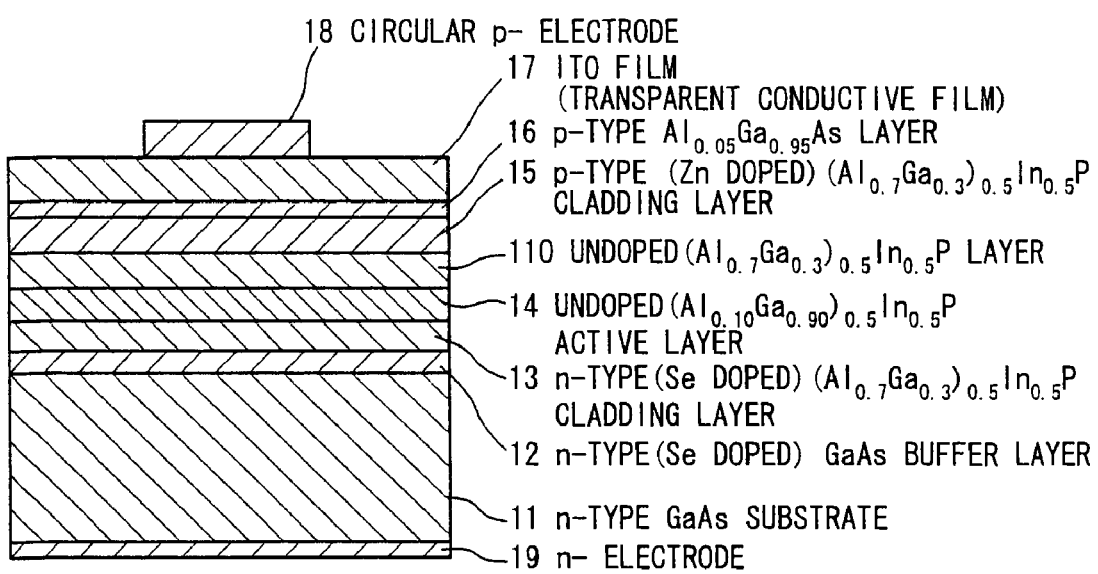
FIG. 8 is a sectional view showing a tenth embodiment of the present invention.

FIG. 8 is a sectional view showing an LED according to the tenth embodiment of the present invention.

(1) This LED is a red LED having an emission wavelength of around 630 nm and the same sectional structure as that shown in FIG. 5, and which is prepared by lamination of an n-type GaAs substrate 11, an n-type (Se doped) GaAs buffer layer (400 nm thickness, $1\times10^{18}$ cm$^{-3}$ carrier concentration) 12, an n-type (Se doped) $(Al_{0.7}Ga_{0.3})_{0.5}In_{0.5}P$ cladding layer (300 nm thickness, $1\times10^{18}$ cm$^{-3}$ carrier concentration) 13, an undoped $(Al_{0.10}Ga_{0.90})_{0.5}In_{0.5}P$ active layer (600 nm thickness) 14, an undoped $(Al_{0.7}Ga_{0.3})_{0.5}In_{0.5}P$ layer (300 nm thickness) 110, a p-type (Zn doped) $(Al_{0.7}Ga_{0.3})_{0.5}In_{0.5}P$ cladding layer (300 nm thickness, $5\times10^{17}$ cm$^{-3}$ carrier concentration) 15, a p-type $Al_{0.05}Ga_{0.95}As$ layer (25 nm thickness, $1\times10^{19}$ cm$^{-3}$ carrier concentration) 16, an ITO film ($6.2\times10^{-6}$ Ωm resistivity) 17 of a transparent conductive film, a circular p-type electrode 18, and an n-type electrode 19. In the following description, an explanation relating to the same contents as those of the fourth through the ninth embodiments is omitted.

Various LEDs each containing the p-type $Al_{0.05}Ga_{0.95}As$ layer 16 wherein an additive or additives to be used is (are) Mg, Be, both Zn and Mg, both Zn and Be, and both Mg and Be are fabricated, respectively.

In the following, results evaluated as to the LEDs of the tenth embodiment are shown in TABLE 6.

TABLE 6

| Additive(s) for AlGaAs layer | Emission Output (mW) | Forward Operative Voltage (V) | Relative Output (%) | Percent Defective (%) |
|---|---|---|---|---|
| Mg | 2.66 | 1.97 | 99 | 1≧ |
| Be | 2.64 | 1.97 | 98 | 1≧ |
| Mg + Zn | 2.68 | 1.96 | 95 | 1≧ |
| Be + Zn | 2.68 | 1.96 | 95 | 1≧ |
| Mg + Be | 2.64 | 1.97 | 97 | 1≧ |
| Zn (The Fourth Embodiment) | 2.71 | 1.96 | 94 | 1≧ |

According to the LEDs of the above-described tenth embodiment, it is possible to obtain a sufficient emission output without increasing forward operative voltage, even when an additive Mg or Be other than Zn is used as is apparent from TABLE 6.

Eleventh Embodiment

Figure 9:
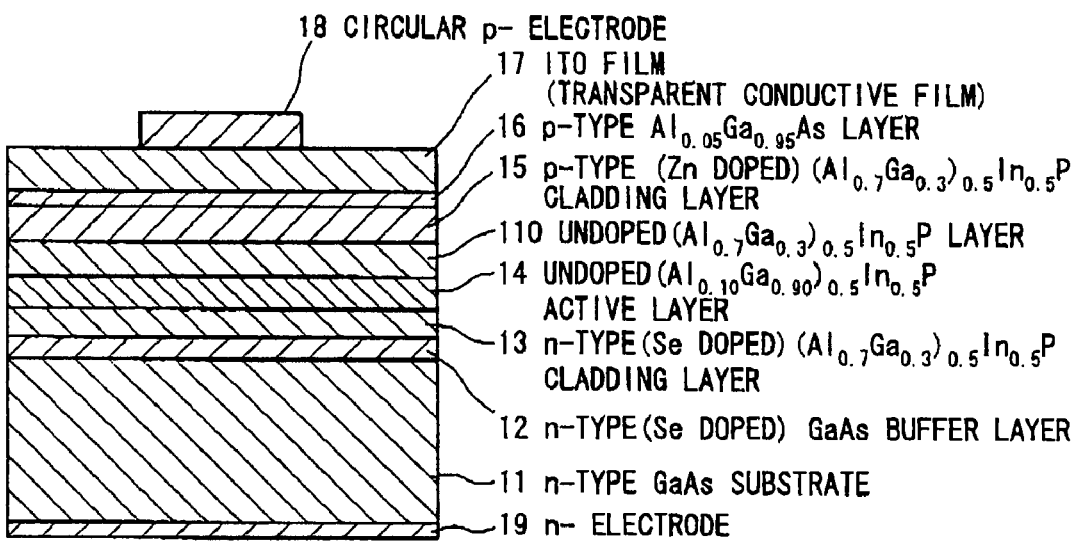
FIG. 9 is a sectional view showing an eleventh embodiment of the present invention.

FIG. 9 is a sectional view showing an LED according to the eleventh embodiment of the present invention.

(1) This LED is a red LED having an emission wavelength of around 630 nm and the same sectional structure as that shown in FIG. 5, and which is prepared by lamination of an n-type GaAs substrate 11, an n-type (Se doped) GaAs buffer layer (400 nm thickness, $1\times10^{18}$ cm$^{-3}$ carrier concentration) 12, an n-type (Se doped) $(Al_{0.7}Ga_{0.3})_{0.5}In_{0.5}P$ cladding layer (300 nm thickness, $1\times10^{18}$ cm$^{-3}$ carrier concentration) 13, an undoped $(Al_{0.10}Ga_{0.90})_{0.5}In_{0.5}P$ active layer (600 nm thickness) 14, an undoped $(Al_{0.7}Ga_{0.3})_{0.5}In_{0.5}P$ layer (300 nm thickness) 110, a p-type (Zn doped) $(Al_{0.7}Ga_{0.3})_{0.5}In_{0.5}P$ cladding layer (300 nm thickness, $5\times10^{17}$ cm$^{-3}$ carrier concentration) 15, a p-type $Al_{0.05}Ga_{0.9}As$ layer (25 nm thickness, $1\times10^{19}$ cm$^{-3}$ carrier concentration) 16, an ITO film ($6.2\times10^{-6}$ Ωm resistivity) 17 of a transparent conductive film, a circular p-type electrode 18, and an n-type electrode 19. In the following description, an explanation relating to the same contents as those of the fourth through the tenth embodiments is omitted.

To the p-type $Al_{0.05}Ga_{0.95}As$ layer 16, C is added at a growth temperature of 550° C. as a result of autodoped. Thus, an amount of Zn to be added to the p-type $Al_{0.05}Ga_{0.95}As$ layer 16 is smaller than that of the fourth embodiment.

As a result of evaluation of LED properties in the resulting LED, a light emission output is 2.70 mW, a forward operative voltage is 1.98 V, and a relative output is 97%, respectively. In addition, it is confirmed that a percent defective is 1% or less. Hence, it is confirmed that LED properties are good, even when addition of autodoped C is combined with Zn addition at a low growth temperature of the AlGaAs layer.

As described above, since each of the LEDs of the eleventh embodiment has a structure including the p-type AlGaAs layer 16 provided between the ITO film 17 and the p-type cladding layer 15 wherein Zn and Mg or Be are added to the p-type AlGaAs layer 16, and further C is added thereto as a result of autodoping, such an LED exhibits a low operative voltage and a good light emission output and has good reproducibility, further by which a sum of a percent defective due to exfoliation of the ITO film 17 and a percent defective due to a backward voltage can be reduced to 1% or less.

Furthermore, even when the undoped layer 110, the second conductivity type low carrier concentration layer 110, or the first conductivity type low carrier concentration is inserted as a layer 110 to be formed between the active layer 14 and the p-type cladding layer 15, such an LED exhibiting both properties of a low operative voltage and a good light emission output and having good reproducibility can be fabricated. In addition, a percent defective due to exfoliation of the ITO film 17 can be remarkably reduced to 1% or less in the LED.

Besides, since an undoped layer (resistance layer) is provided as the layer 112 to be formed in the contact layer other than the layer 110 formed between the active layer 14 and the p-type cladding layer 15, an LED resistant to fluctuation in drive voltage can be fabricated.

Grounds for the optimum conditions in the present invention are as follows.

It is desired that a carrier concentration of the AlGaAs layer 16 is $1\times10^{19}$ cm$^{-3}$ or higher. This is because the fact that tunneling current is hard to flow and a forward operative voltage increases due to band discontinuity to the p-type cladding layer 15, when a carrier concentration of the AlGaAs layer 16 is low. Moreover, the higher carrier concentration of the AlGaAs layer 16 is the more preferred.

The AlGaAs layer 16 has a smaller band gap than that of the active layer 16. For this reason, the AlGaAs layer 16 functions as an absorption layer with respect to emitted light to decrease light emission output. Thus, a thinner AlGaAs layer is desirable. However, when a thickness of the AlGaAs layer 16 is excessively thinned, tunneling current does not flow. Accordingly, there is the optimum value for a thickness of the AlGaAs layer 16.

Furthermore, when an Al composition in the AlGaAs layer 16 varies, a degree of absorption of light emitted varies. Moreover, a degree of light absorption varies also dependent upon a light emission wavelength. Thus, a thickness of the AlGaAs layer 16 depends on such light emission wavelength and an Al composition. Accordingly, there is the optimum thickness dependent upon the Al composition in the AlGaAs layer 16, even when the same light emission wavelength is applied, while the optimum thickness depends on a light emission wavelength, even if the same Al composition of the AlGaAs layer 16 is applied.

In case of a red LED having 630 nm light emission wavelength and an Al composition in the AlGaAs layer 16 being 0.01, i.e. $Al_{0.01}Ga_{0.99}As$ layer, around 1 to 35 nm thickness is preferable, and 2 to 25 nm is more preferred.

Furthermore, in case of a red LED having 630 nm light emission wavelength and an Al composition in the AlGaAs layer 16 being 0.05, around 1 to 50 nm thickness is preferable, and 2 to 25 nm is more preferred.

Moreover, in case of a red LED having 630 nm light emission wavelength and an Al composition in the AlGaAs layer 16 being 0.10, around 1 to 75 nm thickness is preferable, and 2 to 25 nm is more preferred.

Further, in case of a red LED having 630 nm light emission wavelength and an Al composition in the AlGaAs layer 16 being 0.15, around 1 to 75 nm thickness is preferable, and 2 to 35 nm is more preferred.

Still further, in case of a red LED having 630 nm light emission wavelength and an Al composition in the AlGaAs layer 16 being 0.20, around 1 to 75 nm thickness is preferred.

Yet further, in case of a red LED having 630 nm light emission wavelength and an Al composition in the AlGaAs layer 16 being 0.25, around 1 to 100 nm thickness is preferable, and 2 to 75 nm is more preferred.

In addition, in case of a red LED having 630 nm light emission wavelength and an Al composition in the AlGaAs layer 16 being more than 0.25, around 1 to 100 nm thickness is preferable, and 2 to 100 nm is more preferred.

In case of an yellow LED having 590 nm light emission wavelength and an Al composition in the AlGaAs layer 16 being 0.01, i.e. $Al_{0.01}Ga_{0.99}As$ layer, around 1 to 30 nm thickness is preferable, and 2 to 20 nm is more preferred.

Furthermore, in case of an yellow LED having 590 nm light emission wavelength and an Al composition in the AlGaAs layer 16 being 0.05, around 1 to 30 nm thickness is preferable, and 2 to 20 nm is more preferred.

Moreover, in case of an yellow LED having 590 nm light emission wavelength and an Al composition in the AlGaAs layer 16 being 0.10, around 1 to 40 nm thickness is preferable, and 2 to 25 nm is more preferred.

Further, in case of an yellow LED having 590 nm light emission wavelength and an Al composition in the AlGaAs layer 16 being 0.15, around 1 to 50 nm thickness is preferable, and 2 to 25 nm is more preferred.

Still further, in case of an yellow LED having 590 nm light emission wavelength and an Al composition in the AlGaAs layer 16 being 0.20, around 1 to 75 nm thickness is preferable, and 2 to 30 nm is more preferred.

Yet further, in case of an yellow LED having 590 nm light emission wavelength and an Al composition in the AlGaAs layer 16 being 0.25, around 1 to 75 nm thickness is preferable, and 2 to 50 nm is more preferred.

Furthermore, in case of an yellow LED having 590 nm light emission wavelength and an Al composition in the AlGaAs layer 16 being 0.30, around 1 to 75 nm thickness is preferable, and 2 to 50 nm is more preferred.

Moreover, in case of an yellow LED having 590 nm light emission wavelength and an Al composition in the AlGaAs layer 16 being 0.35, around 1 to 75 nm thickness is preferable, and 2 to 50 nm is more preferred.

Further, in case of a yellow LED having 590 nm light emission wavelength and an Al composition in the AlGaAs layer 16 being 0.40, around 1 to 100 nm thickness is preferable, and 2 to 75 nm is more preferred.

In addition, in case of a yellow LED having 590 nm light emission wavelength and an Al composition in the AlGaAs layer 16 being 0.43, around 1 to 100 nm thickness is preferable, and 2 to 100 nm is more preferred.

In case of a green LED having 560 nm light emission wavelength and an Al composition in the AlGaAs layer 16 being 0.01, i.e. $Al_{0.01}Ga_{0.99}As$ layer, around 1 to 25 nm thickness is preferable, and 2 to 15 nm is more preferred.

Furthermore, in case of a green LED having 560 nm light emission wavelength and an Al composition in the AlGaAs layer 16 being 0.05, around 1 to 25 nm thickness is preferable, and 2 to 15 nm is more preferred.

Moreover, in case of a green LED having 560 nm light emission wavelength and an Al composition in the AlGaAs layer 16 being 0.10, around 1 to 30 nm thickness is preferable, and 2 to 20 nm is more preferred.

Further, in case of a green LED having 560 nm light emission wavelength and an Al composition in the AlGaAs layer 16 being 0.15, around 1 to 40 nm thickness is preferable, and 2 to 20 nm is more preferred.

Still further, in case of a green LED having 560 nm light emission wavelength and an Al composition in the AlGaAs layer 16 being 0.20, around 1 to 50 nm thickness is preferable, and 2 to 20 nm is more preferred.

Yet further, in case of a green LED having 560 nm light emission wavelength and an Al composition in the AlGaAs layer 16 being 0.25, around 1 to 50 nm thickness is preferable, and 2 to 20 nm is more preferred.

Furthermore, in case of a green LED having 560 nm light emission wavelength and an Al composition in the AlGaAs layer 16 being 0.05, around 1 to 25 nm thickness is preferable, and 2 to 15 nm is more preferred.

Moreover, in case of a green LED having 560 nm light emission wavelength and an Al composition in the AlGaAs layer 16 being 0.30, around 1 to 50 nm thickness is preferable, and 2 to 20 nm is more preferred.

Further, in case of a green LED having 560 nm light emission wavelength and an Al composition in the AlGaAs layer 16 being 0.35, around 1 to 50 nm thickness is preferable, and 2 to 20 nm is more preferred.

Still further, in case of a green LED having 560 nm light emission wavelength and an Al composition in the AlGaAs layer 16 being 0.40, around 1 to 75 nm thickness is preferable, and 2 to 50 nm is more preferred.

In the ITO film 17, when a resistivity is high, tunneling current stops or is difficult to flow, so that a forward operative voltage becomes high. In this case, current spreading effect decreases also, and a light emission output becomes low. Accordingly, the lower resistivity of the ITO film 17 is the more preferable.

A resistivity of the ITO film 17 is preferably $1 \times 10^{-5}$ Ωm or less, and more preferable is $7 \times 10^{-6}$ Ωm or less.

When a thickness of the ITO film 17 is thin, current spreading effect decreases and a light emission output becomes low. Thus, the thicker thickness of the ITO film 17 is the more preferred. A thickness of the ITO film 17 is preferably 50 nm or more, and more preferable is 200 nm or more.

When the AlGaAs layer 16 is grown at a high temperature, good crystallinity is achieved. Good crystallinity results in difficulty for flowing tunneling current at even the same carrier concentration. Furthermore, elevation of forward operative voltage due to band discontinuity to the p-type cladding layer 15 occurs easily. For this reason, not so good crystallinity of the AlGaAs layer 16 is preferred. Hence, a growth temperature of the AlGaAs layer 16 is preferably 600° C. or lower, and more preferable is 600 to 450° C.

When the AlGaAs layer 16 is grown with a high V/III ratio of a raw material, good crystallinity is attained. Good crystallinity results in difficulty for flowing tunneling current at even the same carrier concentration. Furthermore, elevation of forward operative voltage due to band discontinuity to the p-type cladding layer 15 occurs easily. For this reason, not so good crystallinity of the AlGaAs layer 16 is preferred. Accordingly, it is preferred that a V/III ratio of raw material is low at the time of growing the AlGaAs layer 16.

In the AlGaAs layer 16, when a V/III ratio of raw material is reduced at the time of growth, an amount of C which is added automatically (autodoping) increases. As a result, when a V/III ratio of raw material at the time of growing the AlGaAs layer 16 is reduced, its carrier concentration becomes easily high, and quality of crystal deteriorates. In this respect, it is preferred that a V/III ratio of raw material at the time of growing the AlGaAs layer 16 is determined to be 50 or less, and more preferable is 10 or less in order to decrease a forward operative voltage.

The better result of light emission output and the higher reliability is attained by the thicker thickness of the undoped layer 110 formed between the active layer 14 and the cladding layer 15. This is because Zn contained in the cladding layer 15 suppresses diffusion thereof into the active layer, resulting in suppression of defects due to diffusion. However, when a thickness of the undoped layer 110 exceeds a certain value, effect of the undoped layer 110 becomes small, elevation of light emission output and reliability is saturated. Besides, a forward operative voltage becomes higher with increase in a thickness of the undoped layer 110. In addition, its cost becomes expensive. Accordingly, it is preferred that the undoped layer 110 has not an excessive thickness, but a suitable thickness. In this respect, a thickness of the undoped layer 110 is preferably 100 nm or thicker, and more preferable is 300 to 3000 nm.

When the AlGaAs layer 16 contains Al even in a very small amount, adherence to the ITO film 17 can make better. Thus, it is sufficient that the AlGaAs layer 16 contains at least amount of Al, and it is more preferred that an Al composition is 0.05 or more. However, when the Al composition is larger than 0.43, the AlGaAs layer 16 turns to indirect transition, resulting in difficulty of flowing tunneling current. Thus, it is preferred to select an Al composition in the AlGaAs layer 16 within a range of from 0.01 to 0.43, and more preferable is from 0.05 to 0.4.

As described above, according to an LED of the present invention, since an AlGaAs layer ($Al_xGa_{1-x}As$ ($0.01 \leq X \leq 0.43$)) having a smaller band gap than that of an active layer is provided between a second conductivity type cladding layer and a current spreading layer, decrease in an yield due to exfoliation of a transparent conductive film is suppressed, a forward operative voltage is lowered, besides, high luminance, low operative voltage, inexpensive cost, high reliability and good reproducibility can be achieved.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A light emitting diode, comprising:
   a semiconductor substrate;
   a light-emitting region including an active layer provided between a first conductivity type cladding layer formed over the semiconductor substrate and a second conductivity type cladding layer;
   a transparent conductive film made of a metal oxide and located over the light-emitting region;
   a first electrode formed on the upper side of the transparent conductive film;
   a second electrode formed on the whole or a part of the bottom of the semiconductor substrate;
   a direct transition AlGaAs layer made of $Al_xGa_{1-x}As$ ($0.01 \leq x \leq 0.43$) as a preventing layer for preventing exfoliation of the transparent conductive film, the AlGaAs layer being located between the second conductivity type cladding layer and the transparent conductive film, the AlGaAs layer being added with at least one of Zn, Be and Mg, and C, the AlGaAs layer having a carrier concentration of $1 \times 10^{19}$ cm$^{-3}$ or higher;
   an undoped layer or a low carrier concentration layer formed between the active layer and the second conductivity type cladding layer, wherein the undoped layer or the low carrier concentration layer is a layer other than the active layer and comprises a bandgap greater than the active layer;
   a second conductivity type contact layer formed between the second conductivity type cladding layer and the AlGaAs layer, the second conductivity type contact layer comprising at least two layers; and
   another undoped layer interposed between the at least two layers of the second conductivity type contact layer.

2. The light emitting diode as defined in claim 1, wherein: the AlGaAs layer contains a conductivity type determining impurity at a concentration of $1 \times 10^{19}$ cm$^{-3}$ or higher.

3. The light emitting diode as defined in claim 2, wherein: the AlGaAs layer has a film thickness of 300 nm or less.

4. The light emitting diode as defined in claim 2, wherein: the transparent conductive film is made of indium tin oxide.

5. The light emitting diode as defined in claim 2, wherein: the light-emitting region is made of $(Al_xGa_{1-x})_YIn_{1-Y}P$ ($0 \leq X \leq 1$, $0 \leq Y \leq 1$).

6. The light emitting diode as defined in claim 1, wherein: the AlGaAs layer has a film thickness of 300 nm or less.

7. The light emitting diode as defined in claim 1, wherein: the transparent conductive film is made of indium tin oxide.

8. The light emitting diode as defined in claim 1, wherein: the light-emitting region is made of $(Al_xGa_{1-x})_YIn_{1-Y}P$ ($0 \leq X \leq 1$, $0 \leq Y \leq 1$).

9. The light emitting diode as defined in claim 1, wherein: the AlGaAs layer has a bandgap which is smaller than that of the active layer.

10. The light emitting diode as defined in claim 9, wherein C is autodoped.

11. The light emitting diode as defined in claim 9, wherein: the AlGaAs layer is formed at a growth temperature of 600° C. or lower.

12. The light emitting diode as defined in claim 9, wherein: the AlGaAs layer is formed at a V/III ratio in raw materials of 50 or less at the time of growth.

13. The light emitting diode as defined in claim 9, wherein: the transparent conductive film is made of indium tin oxide.

14. The light emitting diode as defined in claim 9, wherein: the light-emitting region is made of $(Al_xGa_{1-x})_YIn_{1-Y}P$ ($0 \leq X \leq 1$, $0 \leq Y \leq 1$).

15. The light emitting diode as defined in claim 1, wherein C is autodoped.

16. The light emitting diode as defined in claim 1, wherein: the AlGaAs layer is formed at a growth temperature of 600° C. or lower.

17. The light emitting diode as defined in claim 1, wherein: the AlGaAs layer is formed at a V/III ratio in raw materials of 50 or less at the time of growth.

18. The light emitting diode as defined in claim 1, wherein: an Al composition ratio of the AlGaAs layer is from 0.05 to 0.4.

19. The light emitting diode as defined in claim 1, wherein: the AlGaAs layer has a smaller band gap than a band gap of the active layer.

20. The light emitting diode as defined in claim 1, wherein: a thickness of the another undoped layer is 100 nm or more.

21. The light emitting diode as defined in claim 1, wherein: a thickness of the another undoped layer is 300 to 3000 nm.

22. The light emitting diode as defined in claim 1, wherein:
a band gap of the second conductivity type cladding layer is greater than a band gap of the metal oxide of the transparent conductive film and smaller than a band gap of the AlGaAs layer.

23. A light emitting diode, comprising:
a semiconductor substrate;
a light-emitting region including an active layer provided between a first conductivity type cladding layer formed over the semiconductor substrate and a second conductivity type cladding layer;
a transparent conductive film made of a metal oxide and located over the light-emitting region;
a first electrode formed on the upper side of the transparent conductive film;
a second electrode formed on the whole or a part of the bottom of the semiconductor substrate; and
a direct transition AlGaAs layer made of $Al_xGa_{1-x}As$ ($0.01 \leq X \leq 0.43$) as a preventing layer for preventing exfoliation of the transparent conductive film, the AlGaAs layer being located between the second conductivity type cladding layer and the transparent conductive film, the AlGaAs layer being added with at least one of Zn, Be and Mg, and C, the AlGaAs layer having a carrier concentration of $1 \times 10^{19}$ cm$^{-3}$ or higher.

24. The light emitting diode as defined in claim 23, wherein:
the AlGaAs layer contains a conductivity type determining impurity at a concentration of $1 \times 10^{19}$ cm$^{-3}$ or higher.

25. The light emitting diode as defined in claim 24, wherein:
the AlGaAs layer has a film thickness of 300 nm or less.

26. The light emitting diode as defined in claim 24, wherein:
the transparent conductive film is made of indium tin oxide.

27. The light emitting diode as defined in claim 24, wherein:
the light-emitting region is made of $(Al_xGa_{1-X})_YIn_{1-Y}P$ ($0 \leq X \leq 1$, $0 \leq Y \leq 1$).

28. The light emitting diode as defined in claim 23, wherein:
the AlGaAs layer has a film thickness of 300 nm or less.

29. The light emitting diode as defined in claim 23, wherein:
the transparent conductive film is made of indium tin oxide.

30. The light emitting diode as defined in claim 23, wherein:
the light-emitting region is made of $(Al_xGa_{1-X})_YIn_{1-Y}P$ ($0 \leq X \leq 1$, $0 \leq Y \leq 1$).

31. The light emitting diode as defined in claim 23, wherein:
the AlGaAs layer has a bandgap which is smaller than that of the active layer.

32. The light emitting diode as defined in claim 31, wherein C is autodoped.

33. The light emitting diode as defined in claim 31, wherein:
the AlGaAs layer is formed at a growth temperature of 600° C. or lower.

34. The light emitting diode as defined in claim 31, wherein:
the AlGaAs layer is formed at a V/III ratio in raw materials of 50 or less at the time of growth.

35. The light emitting diode as defined in claim 31, wherein:
the transparent conductive film is made of indium tin oxide.

36. The light emitting diode as defined in claim 31, wherein: the light-emitting region is made of $(Al_xGa_{1-X})_YIn_{1-Y}P$ ($0 \leq X \leq 1$, $0 \leq Y \leq 1$).

37. The light emitting diode as defined in claim 23, wherein C is autodoped.

38. The light emitting diode as defined in claim 23, wherein:
the AlGaAs layer is formed at a growth temperature of 600° C. or lower.

39. The light emitting diode as defined in claim 23, wherein:
the AlGaAs layer is formed at a V/III ratio in raw materials of 50 or less at the time of growth.

40. The light emitting diode as defined in claim 23, wherein:
an Al composition ratio of the AlGaAs layer is from 0.05 to 0.4.

41. The light emitting diode as defined in claim 23, wherein:
the AlGaAs layer has a smaller band gap than a band gap of the active layer.

42. The light emitting diode as defined in claim 23, wherein:
a thickness of another undoped layer is 100 nm or more.

43. The light emitting diode as defined in claim 23, wherein:
a thickness of another undoped layer is 300 to 3000 nm.

44. The light emitting diode as defined in claim 23, wherein:
a band gap of the second conductivity type cladding layer is greater than a band gap of the metal oxide of the transparent conductive film and smaller than a band gap of the AlGaAs layer.

* * * * *